(12) United States Patent
Paudel et al.

(10) Patent No.: US 11,476,705 B2
(45) Date of Patent: Oct. 18, 2022

(54) CAPACITIVE POWER HARVESTING

(71) Applicant: ABB Schweiz AG, Baden (CH)

(72) Inventors: Nirmal Paudel, Greenville, NC (US);
Vivek Siddharth, Greenville, NC (US);
David Raschka, Greenville, NC (US);
Ronald D. Pate, Rocky Mount, NC (US)

(73) Assignee: ABB SCHWEIZ AG, Baden (CH)

( * ) Notice: Subject to any disclaimer, the term of this patent is extended or adjusted under 35 U.S.C. 154(b) by 380 days.

(21) Appl. No.: 16/713,953

(22) Filed: Dec. 13, 2019

(65) Prior Publication Data
US 2020/0195041 A1  Jun. 18, 2020

Related U.S. Application Data

(60) Provisional application No. 62/779,168, filed on Dec. 13, 2018.

(51) Int. Cl.
*H02J 50/00* (2016.01)
*H02J 13/00* (2006.01)
(Continued)

(52) U.S. Cl.
CPC ............ *H02J 50/001* (2020.01); *G01R 15/16* (2013.01); *H01G 4/224* (2013.01); *H01G 4/38* (2013.01); *H02J 13/00002* (2020.01)

(58) Field of Classification Search
CPC ........ G01R 15/06; G01R 15/16; G01R 31/08; G01R 19/2513; G01R 22/10; G01R 15/142; G01R 31/58; G01R 22/00; G01R 21/00; G01R 31/00; G01R 19/0084; G01R 19/0092; G01R 31/086; G01R 35/005; G01R 15/144; G01R 21/06; H01G 4/224; H01G 4/38; H01G 4/40; H02J 13/00002; H02J 50/001; H02J 50/05; H04B 3/54; H04B 3/52; H04B 5/0037; H04B 2203/5441; H04B 3/46; H04B 2203/5483; H04B 2203/5458; H04B 3/542; H04B 5/0093; H04B 7/155; H04B 2203/5466; H04B 2203/5487; H04B 2203/5495; H04B 3/00; H04B 5/0012; H04B 5/0075; H04B 3/50; H04B 5/0031; H04B 1/40; H04B 10/90; H04B 7/14; H04B 10/112; H04B 2203/5433; H04B 2203/5408; H04W 84/12; H04W 88/08; H04W 12/126;
(Continued)

(56) References Cited

U.S. PATENT DOCUMENTS 3,586,934 A * 6/1971 Nakata .................... H01G 4/38
361/275.1
3,970,932 A * 7/1976 Harvey ................ G01R 19/145
324/133
(Continued)

*Primary Examiner* — Vinh P Nguyen
(74) *Attorney, Agent, or Firm* — Greenberg Traurig, LLP

(57) ABSTRACT

A power harvesting device is provided that may supply low voltage power to operate devices in remote locations. The power harvesting device may be connected to a medium to high voltage power line. First and second capacitors divide the voltage to a lower voltage sufficient to power a device, such as a monitoring device. The power harvesting device and monitoring device may be connected to an electric tower with the power harvesting device being connected to a power line supported by the tower.

18 Claims, 5 Drawing Sheets

(51) Int. Cl.
*G01R 15/16* (2006.01)
*H01G 4/38* (2006.01)
*H01G 4/224* (2006.01)

(58) Field of Classification Search
CPC ..... H04W 24/06; H04W 12/12; H04W 24/00; H01R 4/28; H01R 13/5205; H01R 13/665; H01R 13/6683; H01R 13/6691; G06F 1/26; G06F 2119/06; G06F 11/3058; G06F 1/1683; G06F 1/3206; G06F 21/87; G06F 3/044
See application file for complete search history.

(56) References Cited

U.S. PATENT DOCUMENTS

| | | | | |
|---|---|---|---|---|
| 4,757,263 A | * | 7/1988 | Cummings, III | G01R 31/1245 702/65 |
| 4,887,185 A | * | 12/1989 | Okumura | H01G 4/35 361/302 |
| 4,998,098 A | * | 3/1991 | Schweitzer, III | G01R 19/16547 361/17 |
| 9,714,957 B2 | * | 7/2017 | Giovanelli | G01R 15/06 |
| 10,958,079 B2 | * | 3/2021 | Liu | G05F 1/67 |

* cited by examiner

CAPACITIVE POWER HARVESTING

BACKGROUND

The present inventions relates to a device for harvesting electrical power from a medium to high voltage power line.

An electric grid is made up of power lines that travel over large distances to supply electric power to various communities and businesses within a region. The electric grid is typically made up of power lines of various voltages depending on the distance to be traveled and the location of the communities and businesses to be supplied with electric power. For example, medium voltage three-phase power lines of 15-35 kV may be used in locations that are closer to communities and businesses where supply lines feed electric power to transformers that supply power to individual homes or facilities. High voltage three-phase power lines of 35-1,100 kV may be used between a power plant and a community when the power line must travel a significant distance or a substantial amount of electric power is needed to feed multiple areas. It is understood that the voltage ranges referred to here are line-to-line AC voltages in a three-phase system. Thus, equivalent line-to-ground voltages can be determined by dividing the line-to-line voltage by 1.73 (e.g., 8.7 kV for medium voltage and 636 kV for high voltage).

In order to modernize the electric grid and improve performance thereof, it is preferable to provide additional monitoring capabilities to sense and/or control the power lines in the grid. For example, current and voltage may be monitored along the power line to determine if the power line is performing as expected and to identify problems therewith. Preferably, such monitoring occurs at regular intervals along the length of a power line. However, one problem is how to provide electric power to local monitoring devices for power lines. That is, new monitoring devices that include microprocessors and programmable logic require a relatively low voltage power supply to operate the monitoring device. However, in the case of power lines, a low voltage power supply is often not readily available. That is, it may not be practical to provide a conventional transformer in some locations for powering monitoring devices. For example, in the case of power lines that travel through remote areas, there may be no low voltage power supply already established in the near vicinity of the power line. Thus, providing monitoring capabilities for power lines with devices requiring a low voltage power supply can be difficult.

SUMMARY

A power harvesting device is described for powering intelligent devices with microprocessors. The power harvesting device includes first and second capacitors that divide an input voltage to a lower output voltage suitable to operate an intelligent device. The power harvesting device may be used in remote locations where low voltage power lines are not readily available. For example, the power harvesting device may be used on electric towers to operate a monitoring device to collect data about power lines supported by the tower.

BRIEF DESCRIPTION OF SEVERAL VIEWS OF THE DRAWINGS

The invention may be more fully understood by reading the following description in conjunction with the drawings, in which.

DETAILED DESCRIPTION

Figure 1:
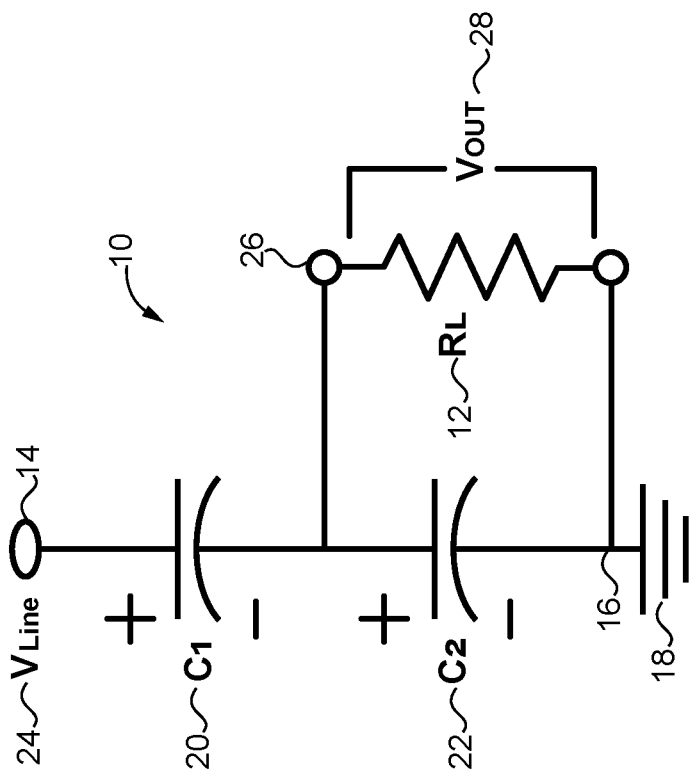
FIG. 1 is an electrical schematic of a power harvesting device.
Figure 4:
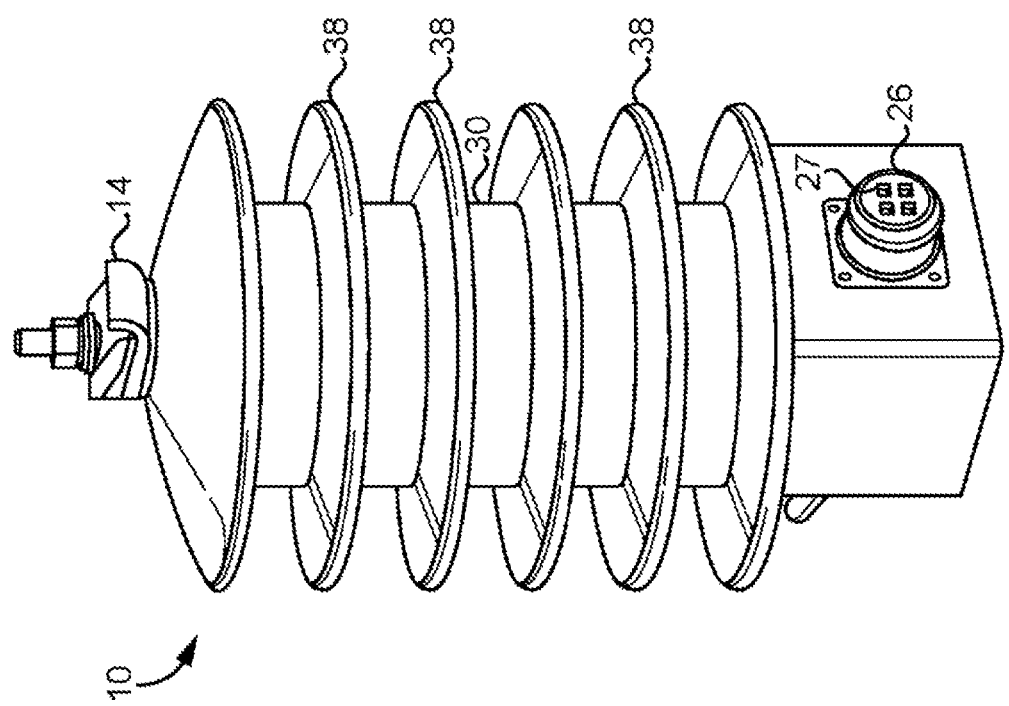
FIG. 4 is a side perspective view of the power harvesting device.

Referring now to the drawings, a power harvesting device 10 is shown in FIG. 4 that may be used to harvest AC electric power from a medium to high voltage power supply to provide low voltage AC power to operate a device 12, such as a monitoring device 12 (see FIG. 8) with a microprocessor 58 with programmable instructions. An electric schematic of the harvesting device 10 is shown in FIG. 1. As shown, the harvesting device 10 has an input voltage terminal 14 and a first output voltage terminal 16. Preferably, the first output voltage terminal 16 is connected to ground 18. At least two capacitors 20, 22 are arranged in series between the input voltage terminal 14 and the first output voltage terminal 16. Because the first capacitor 28 will be directly connected to medium to high voltages at the input voltage terminal 14, the first capacitor 20 must be rated for higher voltages than many common capacitors. For example, for the power harvesting device 10 to be used with medium voltage power lines 24, the first capacitor 20 should be rated for at least 5 kV. More preferably, the first capacitor 20 is rated for more than 10 kV to handle 15 kV three-phase line-to-line power lines 24, more than 25 kV to handle 35 kV three-phase line-to-line power lines 24, and more than 35 kV to handle 55 kV three-phase line-to-line power lines 24.

A second output voltage terminal 26 is connected between the first and second capacitors 20, 22. Where the input voltage terminal 14 is connected to a voltage 24 of 5 kV or higher, and the first output voltage terminal 16 is connected to ground 18, the output voltage 28 across the second output voltage terminal 26 and the first output voltage terminal 16 will be lower than the voltage 24 at the input voltage terminal 14. The level of the output voltage 28 is determined by the ratio of capacitances between the second capacitor 22 and the first capacitor 20. Generally, it will be desirable for the capacitance of the second capacitor 22 to be more than the capacitance of the first capacitor 20. For example, it may be desirable for the capacitance of the second capacitor 22 to be in the range of 250-500 nF and the capacitance of the first capacitor 20 to be in the range of 5-25 nF. In particular, the ratio of the capacitance of the second capacitor 22 to the capacitance of the first capacitor 20 is greater than 10. The ratio may also be between 10 and 2,000, between 10 and 100, and between 20 and 60.

Figure 5:
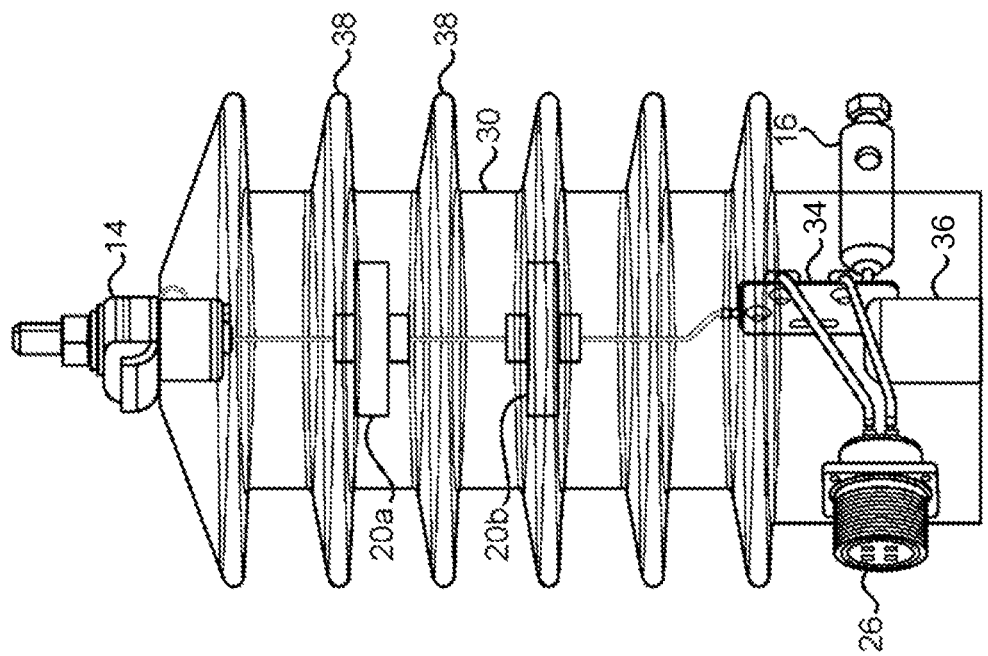
FIG. 5 is a side view showing components within the power harvesting device.

It is understood that the first and second capacitors 20, 22 may be made up of multiple capacitors to achieve the desired voltage ratings and capacitances. For example, as shown in FIG. 5, the first capacitor 20 may be made up of two capacitors 20a, 20b in series. It may also be desirable for the second capacitor 22 to be made up of two capacitors in parallel to achieve a higher capacitance. However, it is also possible for the first capacitor 20 to be made up of multiple capacitors in parallel and for the second capacitor 22 to be made up of multiple capacitors in series.

Figure 2:
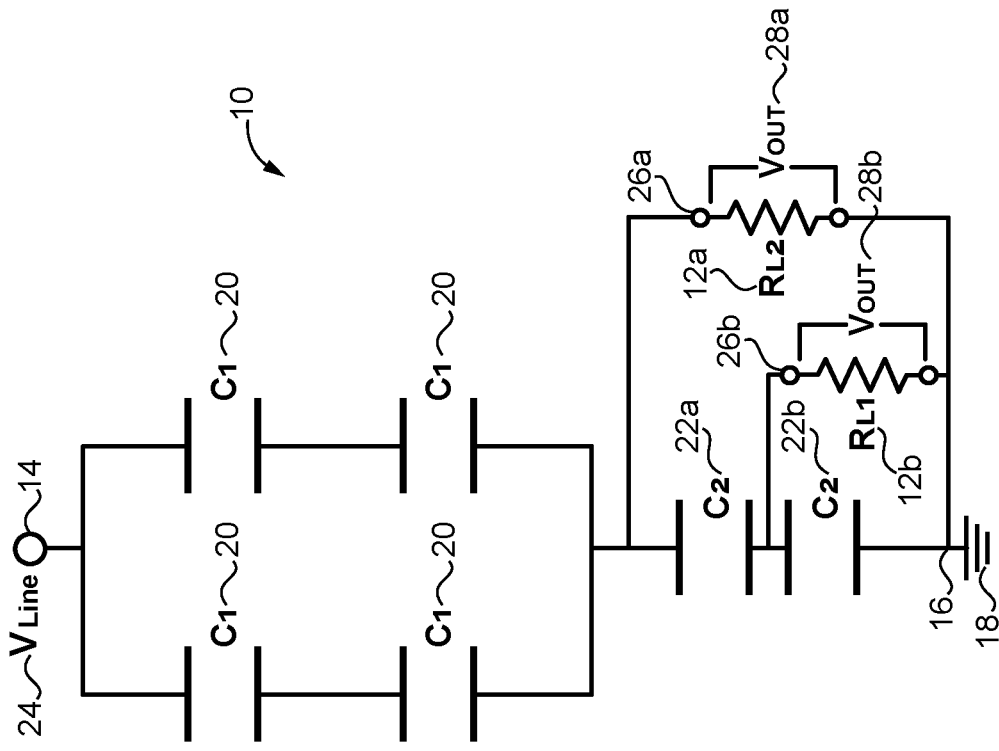
FIG. 2 is an electrical schematic of another power harvesting device providing multiple low voltage outputs.

Another multiple capacitor arrangement for the power harvesting device 10 is shown in FIG. 2. As shown, the first capacitor 20 may be made up of four capacitors 20 with two series capacitors 20 in parallel with two other series capacitors 20. The second capacitor 22 may also be made up of two capacitors 22a, 22b in series. As shown, this arrangement may be used to provide two different output voltages 28a, 28b at different voltage levels to power different devices 12a, 12b or loads. Additional capacitors 22 may also be used to provide more than two output voltages 28 if desired. Thus, in this arrangement, one second output voltage terminal 26a is connected between the first capacitor 20 and the first second capacitor 22a, and another second output voltage terminal 22b is connected between the two second capacitors 22a, 22b. Although the two second output voltage terminals 26a, 26b may be provided as two separate plug connections on the harvesting device 10. It may also be desirable as shown in FIG. 4 to provide a single plug connector 26 with multiple pin connectors 27. Thus, in this arrangement one pin 27 may be connected to ground 18, one pin 27 may be connected to the first second output voltage terminal 26a to provide a higher output voltage 28a, and another pin 27 may be connected to the second second output voltage terminal 26b to provide a lower output voltage 28b.

Figure 3:
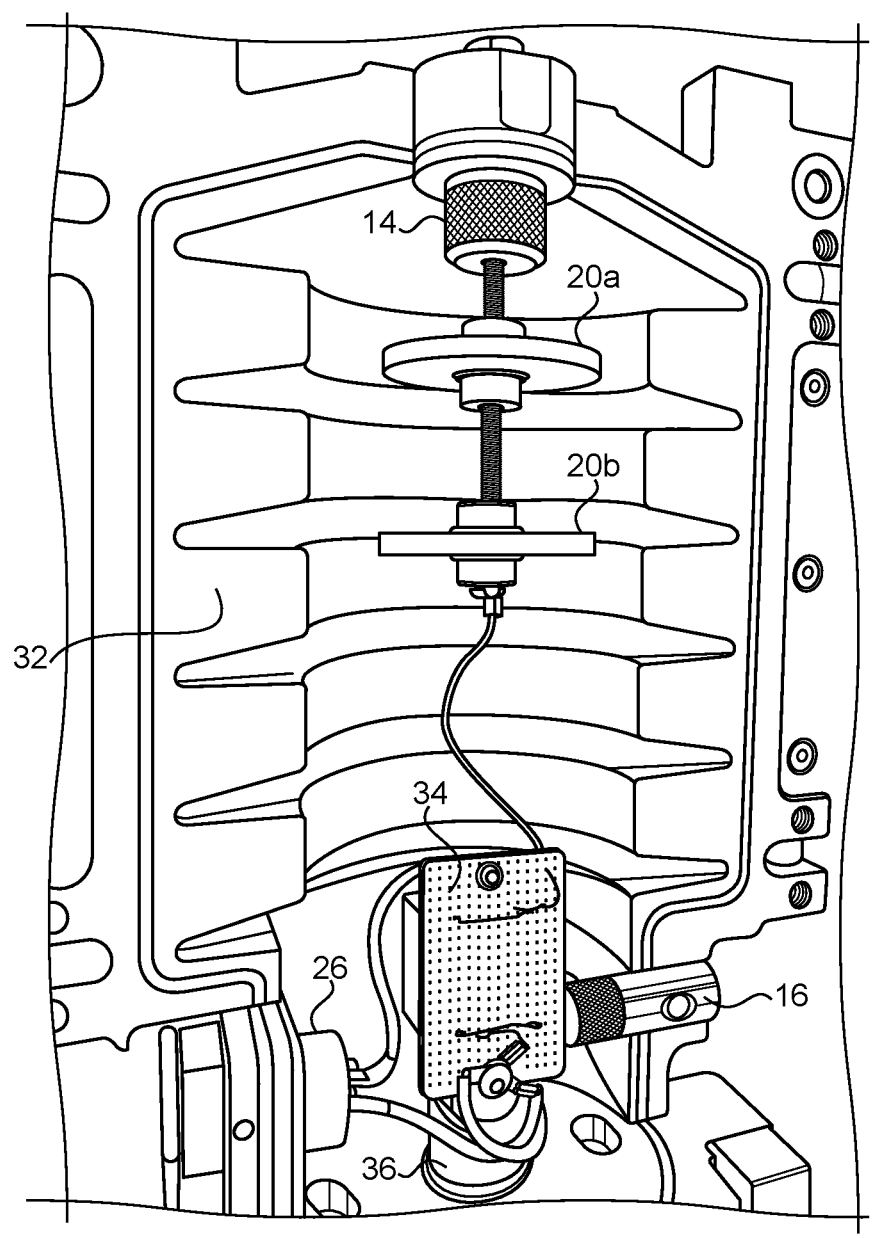
FIG. 3 is a side view of a mold used to form a housing for the power harvesting device.

The first capacitor 20 is preferably made of ceramic. This allows the first capacitor 20 to have a higher voltage rating, provides heat resistance and good bonding characteristics. For example, as shown in FIG. 3, it may be desirable to make the power harvesting device 10 with a molding process where at least the first capacitor 20 is embedded within an electrically insulated housing 30. In FIG. 3, the mold 32 for the housing 30 is shown and the first capacitor 20 (two capacitors 20a, 20b in series) are shown suspended within the mold 32. A printed circuit board 34 which includes the second capacitor 22 is also shown within the mold 32. It is noted that because the second capacitor 22 will be exposed to a lower voltage than the first capacitor 20, the voltage rating and size of the second capacitor 22 may be much smaller than the first capacitor 20. Thus, as shown, the second capacitor 22 may be mounted on a printed circuit board 34 if desired. In order to form the housing 30 for the harvesting device 10, electrically insulating material, such as epoxy, may be injected into the mold 32. As a result, the first and second capacitors 20, 22 and portions of the input voltage terminal 14, first output voltage terminal 16, second output voltage terminal 26, and threaded mounting connection 36 are embedded within the electrically insulating material of the housing 30.

The power harvesting device 10 with the electrically insulated housing 30 is shown in FIGS. 4 and 5. As shown, the housing 30 is preferably cylindrical with the input voltage terminal 14 at one end and the first and second output voltage terminals 16, 26 at the other end. The housing 30 is also preferably provided with integral electrically insulated sheds 38 around the exterior of the housing 30 to further insulate the input voltage terminal 14 from the first and second output voltage terminals 16, 26 to prevent arcing therebetween or between the input voltage terminal 14 and the structure 40 to which the power harvesting device 10 is mounted (see FIG. 8). A threaded mounting connection 36 is also preferably provided at the end of the housing 30 opposite from the input voltage terminal 14. The mounting connection 36 allows the power harvesting device 10 to be attached to a structure 40, such as an electrical tower 42 or other desired location. It may also be desirable for the mounting connection 36 to be connected to the first output voltage terminal 16 to permit the power harvesting device 10 to be connected to ground 18 through the structure 40 which the device 10 is connected to with the threaded mounting connection 36. As shown in FIGS. 4 and 5, the input voltage terminal 14 may be a larger cable clamp 14 connected directly to a power line 24, or more preferably, to a jumper cable 44 that is connected to the power line 24. The first output voltage terminal 16 may be a smaller cable or wire clamp 16 to connect the first, output voltage terminal 16 to ground 18. The second output voltage terminal 26 preferably includes a plug port 26 to connect a power cord 46 for a device 12 to be powered by the power harvesting device 10 at a lower AC voltage. It is understood that the plug port 26 preferably also includes a connection to the grounded first, output voltage terminal 16 to provide a complete power circuit for the device 12 to be powered.

Figure 6:
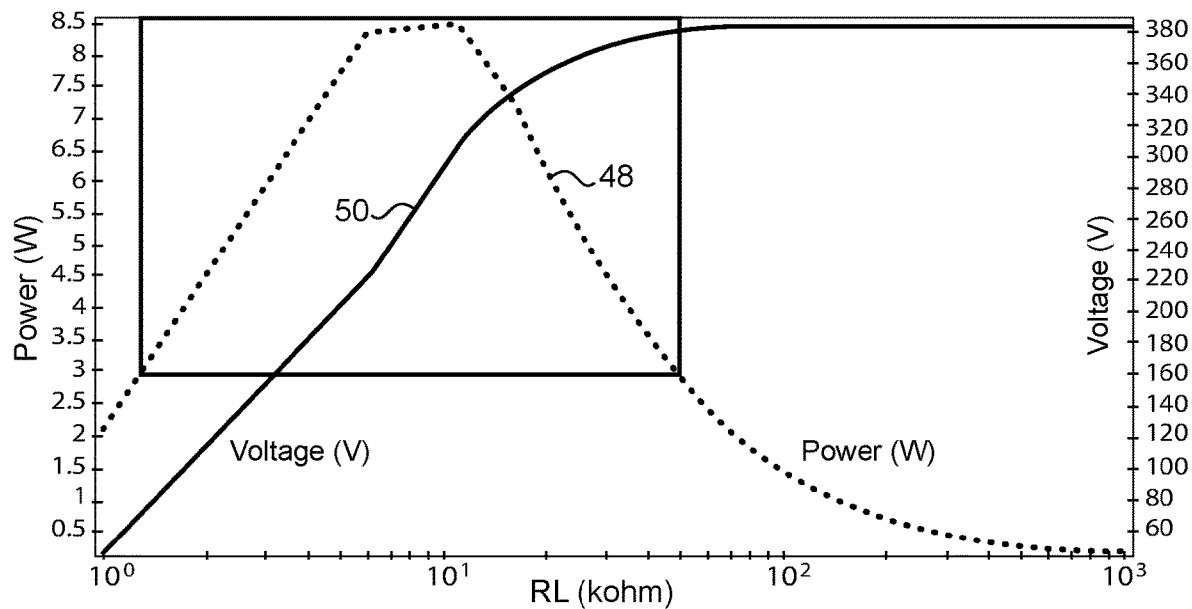
FIG. 6 is a chart showing impedances of a load at the second output voltage terminal along the horizontal axis and output power and voltage along the vertical axes.
Figure 7:
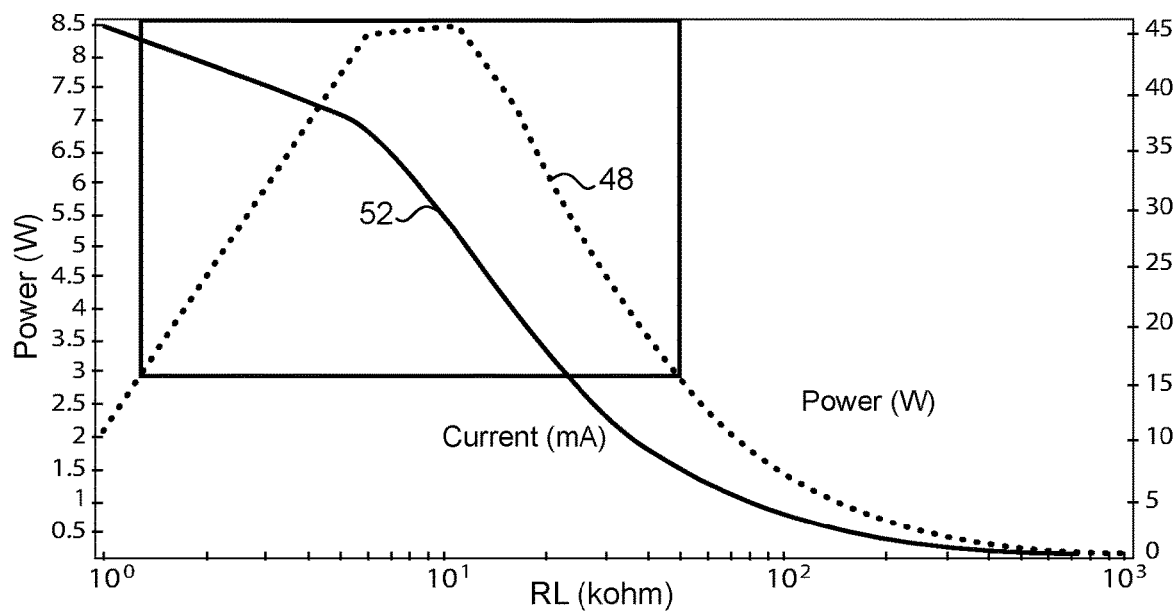
FIG. 7 is a chart showing impedances of the load at the second output voltage terminal along the horizontal axis and output power and current along the vertical axes.

An example of the output of the power harvesting device 10 is shown in FIGS. 6 and 7. In the illustrated example, the voltage 24 of the input voltage terminal 14 is 7.2 kV and the capacitances of the first and second capacitors 20, 22, respectively, are 17 nF and 300 nF. As shown in FIG. 6, power output 48 is between 3 W and 8.5 W and the output voltage 50 at the second output voltage terminal 26 is between 160 V and 380 V when the impedance of the device 12 being powered by the harvesting device 10 is between 1.3 kohm and 50 kohm. As shown in FIG. 7, the output current 52 is between 15 mA and 45 mA. Outside of this window (i.e., defined by a useful range of possible impedances of the powered device 12), the output power 48, voltage 50 and current 52 drop off significantly. Thus, it can be seen that the power harvesting device 10 may be more useful in powering devices 12 that fall within a specific range of impedances and have low power requirements. Thus, the power harvesting device 10 may be most useful where the device 12 to be powered by the second output voltage terminal 26 has an impedance between 1 kohm and 70 kohm and a power consumption of less than 16 W.

Figure 8:
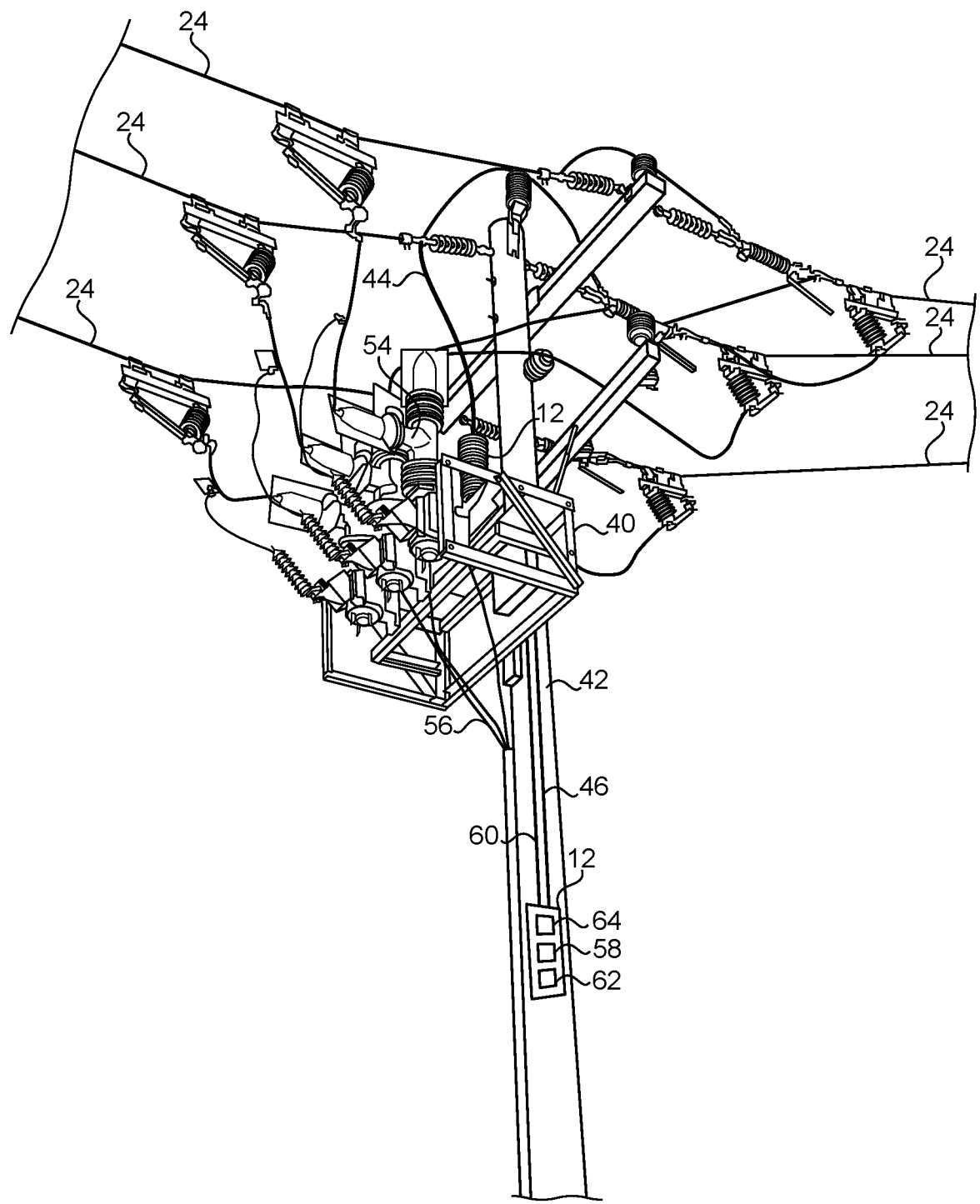
FIG. 8 is a perspective view of an electrical tower with the power harvesting device and a monitoring device.

As shown in FIG. 8, the power harvesting device 10 may be particularly useful for powering a monitoring device 12 on an electric tower 42. As shown, the tower 42 supports power lines 24, which may be three-phase AC power lines 24 of at least 5 kV each line-to-ground. A support frame 40 may be attached to the electric tower 42 to support various types of electrical equipment associated with the power lines 24. For instance, a recloser 54 for each of the power lines 24 may be mounted to the support frame 40. Each of the reclosers 54 is connected to a respective power line 24 with a jumper cable and to an output line 56 that drops down from the tower 42 or is directed to another tower. Enclosed within each recloser 54 is a switch that can be opened to disconnect the power line 24 from the output line 56 if a power surge occurs in the power line 24 or other undesirable conditions occur. Preferably, the recloser 54 switch is controlled by a local monitoring device 12, or a local monitoring device 12 senses an electrical property of the power lines 24 and transmits such information to another controller or individual.

The local monitoring device 12 is preferably also connected to the electrical tower 42. One of the power lines 24 may be connected to the input voltage terminal 14 of the harvesting device 10 with a jumper cable 44. The first output voltage terminal 16 may be connected to ground 18 through the threaded mounting connection 36 to the support frame 40 or by using the alternative cable or wire clamp 16. A power cord 46 may connect the second output voltage terminal 26 to the monitoring device 12 to supply low voltage AC power to operate the monitoring device 12. Preferably, the monitoring device 12 includes a microprocessor 58 with programmable logic to analyze data, store data and/or control another device. Thus, as shown, it may be desirable for a control cable 60 to connect the monitoring device 12 to the recloser 54 to allow the monitoring device 12 to control switching operations of the recloser 54. If desired, the monitoring device 12 may also include a wireless transmitter 62 to communicate sensing data to another controller or individual at a different location. It may also be desirable for the monitoring device 12 to include a battery 64 that directly supplies power to operate the monitoring device 12. The power harvesting device 10 may then be used to charge the battery 64 in order to maintain operation of the monitoring device 12.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that, the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A power harvesting device, comprising:
    an input voltage terminal;
    a first output voltage terminal;
    a first capacitor connected to the input voltage terminal;
    a second capacitor connected in series with the first capacitor between the first capacitor and the first output voltage terminal;
    a second output voltage terminal connected between the first and second capacitors; and
    an electrically insulated housing with a threaded mounting connection, the input voltage terminal being separated from the threaded mounting connection by the insulated housing;
    wherein the threaded mounting connection is connected to the first output terminal;
    wherein the first capacitor has a voltage rating higher than 5 kV.

2. The power harvesting device according to claim 1, wherein the first and second capacitors are disposed within an electrically insulated housing, and the housing comprises a plurality of electrically insulated sheds around an exterior thereof between the input voltage terminal and the first output voltage terminal.

3. The power harvesting device according to claim 1, wherein the first and second capacitors are disposed within an electrically insulated housing, and the housing comprises a plurality of electrically insulated sheds around an exterior thereof between the input voltage terminal and the second output voltage terminal.

4. The power harvesting device according to claim 1, further comprising electrically insulated sheds around an exterior of the housing between the input voltage terminal and the threaded mounting connection.

5. The power harvesting device according to claim 1, wherein the first capacitor is made of ceramic.

6. The power harvesting device according to claim 1, wherein the first capacitor comprises two capacitors in series.

7. The power harvesting device according to claim 1, wherein the second capacitor comprises two capacitors in series, another second output voltage terminal being connected between the two second capacitors.

8. The power harvesting device according to claim 1, further comprising an electrically insulated housing made of epoxy, the first capacitor being embedded within the epoxy.

9. The power harvesting device according to claim 1, wherein a ratio of capacitance between the second capacitor and the first capacitor, respectively, is greater than 10.

10. The power harvesting device according to claim 9, wherein the ratio of capacitance between the second capacitor and the first capacitor, respectively, is between 10 and 2,000.

11. The power harvesting device according to claim 10, wherein the ratio of capacitance between the second capacitor and the first capacitor, respectively, is between 20 and 60.

12. A power line monitoring system, comprising:
    an AC power line,
    a power harvesting device according to claim 1, wherein the input voltage terminal is connected to the AC power line and the first output voltage terminal is connected to a ground, and
    a monitoring device connected to the second output voltage terminal, the second output voltage terminal providing electrical power to operate the monitoring device.

13. The power line monitoring system according to claim 12, wherein the monitoring device senses an electrical property of the AC power line.

14. The power line monitoring system according to claim 12, wherein the monitoring device comprises wireless communications to transmit sensing data.

15. The power line monitoring system according to claim 12, further comprising an electrical tower supporting the AC power line, wherein the power harvesting device is connected to the electrical tower.

16. The power line monitoring system according to claim 15, wherein the monitoring device is connected to the electrical tower.

17. The power line monitoring system according to claim 12, further comprising a battery connected between the second output voltage terminal and the monitoring device, the second output voltage terminal charging the battery and the battery providing electrical power to operate the monitoring device.

18. The power line monitoring system according to claim 12, wherein the AC power line transmits at least 5 kV.

\* \* \* \* \*